US009479160B2

(12) United States Patent
Srihari et al.

(10) Patent No.: US 9,479,160 B2
(45) Date of Patent: Oct. 25, 2016

(54) RESONANT RADIO FREQUENCY SWITCH

(71) Applicant: GLOBALFOUNDRIES INC., Grand Cayman (KY)

(72) Inventors: Srikanth Srihari, Bangalore (IN); Venkata N. R. Vanukuru, Bangalore (IN)

(73) Assignee: GlobalFoundries, Inc., Grand Cayman (KY)

( * ) Notice: Subject to any disclaimer, the term of this patent is extended or adjusted under 35 U.S.C. 154(b) by 148 days.

(21) Appl. No.: 14/573,238

(22) Filed: Dec. 17, 2014

(65) Prior Publication Data

US 2016/0182037 A1 Jun. 23, 2016

(51) Int. Cl.
*H03K 17/687* (2006.01)
*H01Q 1/50* (2006.01)

(52) U.S. Cl.
CPC .............. *H03K 17/687* (2013.01); *H01Q 1/50* (2013.01)

(58) Field of Classification Search
CPC .............................. H01Q 1/50; H03K 17/687
See application file for complete search history.

(56) References Cited

U.S. PATENT DOCUMENTS 6,118,985 A 9/2000 Kawakyu et al.
6,496,083 B1 12/2002 Kushitani et al.
7,538,643 B2 5/2009 Mizutani
7,812,689 B2 10/2010 Atsumo et al.
8,130,055 B2 3/2012 Hayashi et al.
8,135,357 B1 3/2012 Chang et al.
8,165,535 B2 4/2012 Ahn et al.
8,228,112 B2 7/2012 Reynolds
8,466,736 B1 6/2013 Reynolds
2010/0081410 A1 4/2010 Kaido et al.
2011/0140764 A1 6/2011 Shin et al.
2012/0262217 A1 10/2012 Gorbachov et al.
2014/0009214 A1 1/2014 Altunkilic et al.
2014/0043203 A1* 2/2014 Sabouri .................... H01Q 1/50 343/860

OTHER PUBLICATIONS

Kuhn et al., "A Resonant Switch for LNA Protection in Watt-Level CMOS Transceivers", IEEE Transactions on Microwave Theory and Techniques, vol. 53, No. 9, Sep. 2005, © 2005 IEEE, pp. 2819-2825.

Talwalkar et al., "Integrated CMOS Transmit-Receive Switch Using LC-Tuned Substrate Bias for 2.4-GHz and 5.2-GHz Applications", IEEE Journal of Solid-State Circuits, vol. 39, No. 6, Jun. 2004, © 2004 IEEE, pp. 863-870.

(Continued)

*Primary Examiner* — David Bilodeau
(74) *Attorney, Agent, or Firm* — Hoffman Warnick LLC; David Cain

(57) ABSTRACT

An SPDT switch in a RF communication transceiver provides for choosing the transmit/receive path for the RF signal. It consists of the series and shunt branches each consisting of stack of FETs. Performance metrics of the RF switch are insertion loss and isolation. At high frequency, the device/FET capacitance and the parasitic capacitances provide a leakage path for the signal, resulting in higher insertion loss and lower isolation. A parallel resonant LC network across each of the series and/or shunt branch FETs in a SPDT switch provides lower insertion loss, higher switch isolation, and lower out of band harmonics when compared to that of the state of the art SPDT switch. A method to reduce the form factor of such switch configuration is disclosed which is useful in wireless front end modules.

19 Claims, 5 Drawing Sheets

(56) References Cited

OTHER PUBLICATIONS

Tokumitsu et al., "A Low-Voltage, High-Power T/R-Switch MMIC Using LC Resonators", IEEE Transactions on Microwave Theory and Techniques, vol. 43, No. 5, May 1995, © 1995 IEEE, pp. 997-1003.

Wu et al., "A 0.13 μm CMOS T/R Switch Design for Ultrawideband Wireless Applications", ISCAS 2006, © 2006 IEEE, pp. 3758-3761.

* cited by examiner

RESONANT RADIO FREQUENCY SWITCH

BACKGROUND OF THE INVENTION

The present invention relates generally to the field of radio frequency (RF) communications, front end units, and transceivers, and more particularly to RF switches for selecting between transmit and receive modes in wireless communications.

Switches used in selecting between transmit and receive modes are typically of the single pole, double throw (SPDT) type. An SPDT is a configuration of two series-shunt branches, each consisting of stacked field effect transistors (FETs). The series branches, to which the shunt branch is not connected, are tied together at one end and are usually connected to an RF antenna. The other ends of the series branches connect to different ports, typically, the transmit and receiver ports, forming a double throw configuration. Performance metrics of RF switches include: (i) insertion loss; (ii) switch isolation; (iii) power handling capability; (iv) harmonic power levels; and (v) form factor.

SUMMARY

A circuit is provided, the circuit including: a first switch, a second switch, a first inductor/capacitor (LC) network; and a second LC network. The first switch is connected between two high frequency terminals. The first LC network is connected in parallel across the first switch. The second switch is connected between the first terminal and a third terminal, which is a low frequency terminal. The second LC network is connected in parallel across the second switch. The first and second switches are controlled so that the first and second switches have different ON/OFF status during operation of the circuitry.

A circuit is provided, the circuit including: a first series switch and a first shunt switch controlled such that the first series switch and the first shunt switch have different ON/OFF status during operation of the circuitry; a second series switch and a second shunt switch controlled such that the second series switch and the second shunt switch have different ON/OFF status during operation of the circuitry; the first series switch and the second series switch controlled so that the first series switch and the second series switch have different ON/OFF status during operation of the circuitry; and a first resonant circuit in parallel with the first series switch.

A circuit is provided, the circuit including: an RF antenna in series with a first terminal and a second terminal, the RF antenna between the first terminal and the second terminal; a first series switch in series between the RF antenna and the first terminal; a first shunt switch in between the first terminal and a low-frequency terminal; the first series switch and the first shunt switch controlled such that the first series switch and the first shunt switch have different ON/OFF status during operation of the circuitry; a second series switch in series between the RF antenna and the second terminal; a second shunt switch in between the second terminal and a low-frequency terminal; the second series switch and the second shunt switch controlled such that the second series switch and the second shunt switch have different ON/OFF status during operation of the circuitry; a first resonant circuit in parallel with the first series switch and the first shunt switch; and a second resonant circuit in parallel with the second series switch and the second shunt switch. The first terminal is a communication-receiving terminal. The second terminal is a communication-transmitting terminal.

DETAILED DESCRIPTION

A parallel resonant LC network across each of the series-shunt branch FETs in an RF circuit is provided for improved insertion loss, switch isolation, and out of band harmonics. An external capacitor is placed in parallel with a FET to reduce the required inductance value for resonance. Further, a single inductor with multiple taps, or ports, may be used by some embodiments of the present invention for resonating multiple series-shunt branches.

Figure 1:
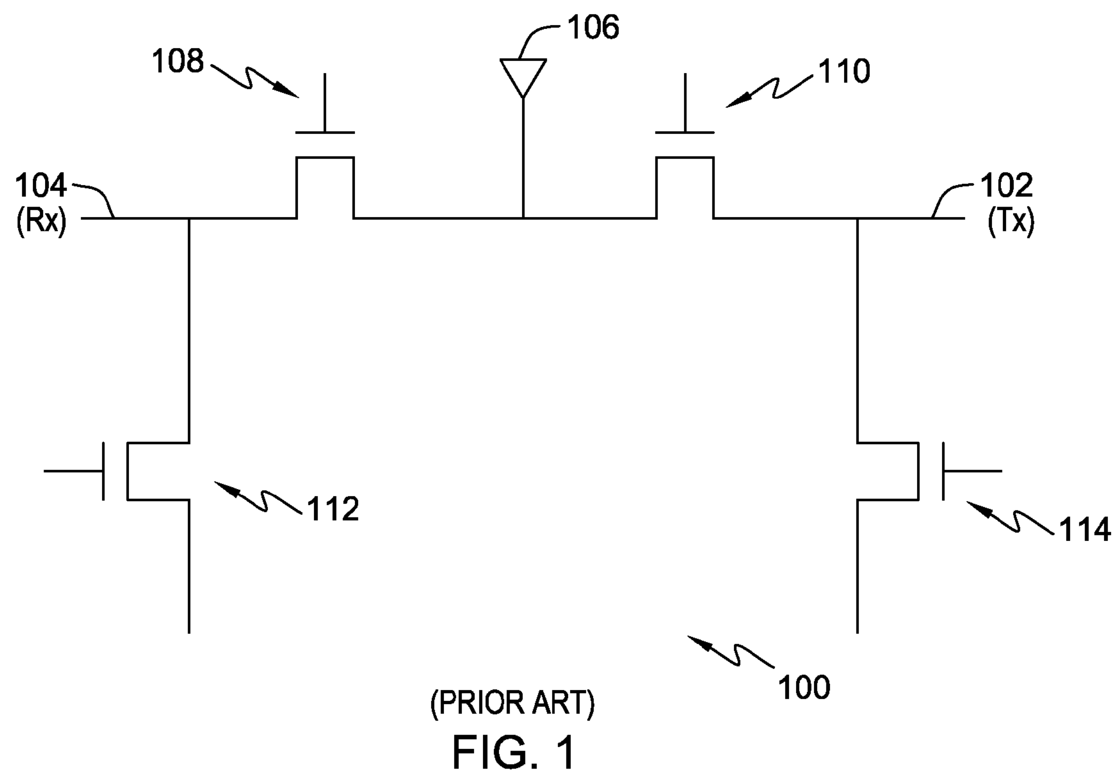
FIG. 1 is a circuit diagram of a prior art switch device.

FIG. 1 shows prior art SPDT switch 100. According to the illustrated circuit, when transmit path 102 is ON, the receive port is OFF and a signal is transferred to RF antenna 106 from the transmit port. Ideally, nothing is transferred to the receive port as series FET 108 connecting to the receive port is in OFF condition. However, due to the leakage path because of the capacitances of FETs 108, 110, 112, and 114, some signal reaches the receive port. This is a performance metric of the switch, called "isolation." Isolation describes how much the unintended port is isolated from the other in SPDT switch 100. The same explanation holds when the receive port is ON and the transmit port is OFF. Another performance metric of the switch is "insertion loss." Insertion loss describes the amount of signal lost during transmission of the signal.

Some embodiments of the present invention circumvent the problem of leakage of the SPDT switch described above, thereby improving the isolation and reducing the insertion loss, when compared to the conventional SPDT switch. The resonant circuit in parallel to the FET resonates out the capacitance of the FET, resulting in higher isolation. Said differently, the capacitance of the FET is essentially cancelled out due to the configuration of the circuit.

Some embodiments of the present invention are directed to a switch with a resonant inductor-capacitor (LC) network in parallel with each of the switch FETs in the series-shunt branches at frequencies of interest in cellular and/or wireless applications, for example 800-2500 MHz. The LC network supports tuning out (or, essentially, cancelling out) the off-state and on-state device capacitances within the circuit as well as the parasitic capacitances of the transmit and/or receive paths, improving: (i) insertion loss; (ii) isolation; (iii) fixed costs; and (iv) out of band harmonic power levels.

Some embodiments of the present invention are directed to a circuit that achieves the preferred small form-factor in cellular and wireless devices. Accordingly, a large capacitor is used in a resonant network to reduce the parallel inductance needed for resonance, thereby reducing the physical area occupied by the switch. The reduced value of the inductor, typically from a few nH to a few pH, based on the frequency of the application, reduces the form-factor and the parasitic resistance of the inductor. To further reduce the circuit footprint, some embodiments of the present invention use a multiport inductor for resonating multiple series and/or shunt FET branches.

A capacitor used in some embodiments of the present invention may be realized by, for example: (i) high density MIM (metal-insulator-metal); (ii) VNCAP (vertical interdigitated metals forming capacitors); (iii) deep trench capacitors (DTCAPs); and/or (iv) voltage controlled capacitors, such as MOSFET varactor (MOSVAR). In some embodiments, the capacitor is placed in parallel with the switch capacitances (FET and parasitic capacitances) and is "constant" with the bias. It is constant in that the capacitance does not vary with the voltage across the terminals (bias) of the capacitor. In that way, the switch does not contribute to the harmonics. In some embodiments of the present invention, a bypass capacitor used for increased power handling may be absorbed into the external tuning capacitor. Such a bypass capacitor is connected in parallel to the FET, similar to the arrangement of the capacitor in the resonant switch circuit. An inductor used in some embodiments of the present invention may be, for example: (i) spiral inductors; (ii) trench inductors; and/or (iii) active inductors (e.g. gyrator-based inductors). Wiring inductance may be used to resonate a large capacitor.

Some embodiments of the present invention disclose a high performance SPDT RF switch, comprising a parallel resonant LC network across all the series-shunt branch FETs. Alternatively, the parallel resonant LC network is located along one series-shunt branch. This network helps to tune out the off/on-state device capacitances. The term, "device," as used herein, indicates a FET, or any other device(s) forming the switch. Also, parasitic capacitances are tuned out in the transmit/receive path, thus improving the insertion loss and isolation of the switch at cellular/wireless application frequencies, such as 800 to 2500 MHz.

Some embodiments of the present invention include a resonant RF switch as part of the antenna tuning circuit to improve the tuning ratio. The tuning ratio is the ratio of the maximum capacitance (Cmax) to the minimum capacitance (Cmin) with respect to the antenna tuner. In the illustrated embodiments, an antenna is used as an example application for the disclosed RF switch. It will be understood by those skilled in the art that other applications exist where such an RF switch is desirable.

Figure 2:
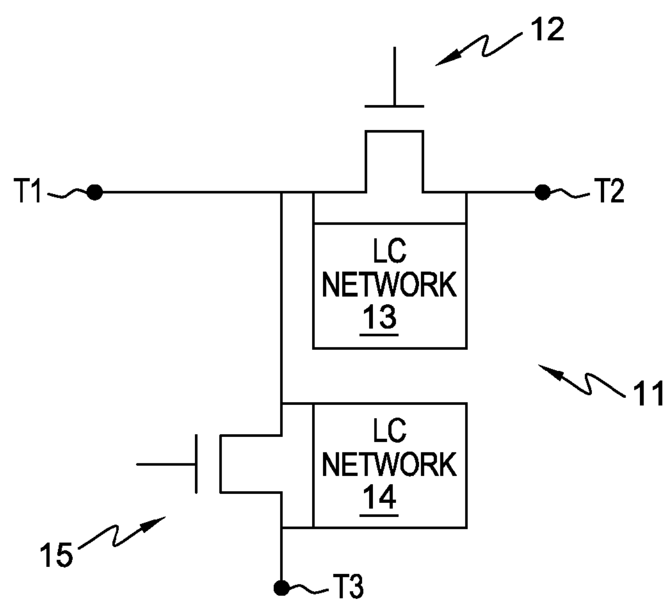
FIG. 2 is a circuit diagram showing a first embodiment of a resonant radio frequency (RF) switch device according to the present invention.

As shown in FIG. 2, resonant switch circuitry 11 includes first switch 12, first inductor/capacitor network 13, second inductor/capacitor network 14, second switch 15, high frequency terminals T1 and T2, and constant voltage terminal T3 (for example, in some embodiments T3 is a ground terminal with a frequency of zero). In this embodiment, first and second switches 12, 15 are FETs (field effect transistors), and first and second inductor/capacitor networks 13, 14 each include at least one inductor and one capacitor.

First switch 12 performs high frequency switching between high frequency terminals T1 and T2. As is conventional, first inductor/capacitor network 13 is connected in parallel with first switch 12, improving isolation at resonant frequency. Also, first inductor/capacitor network 13 reduces inductance across first switch 12, needed for resonance, because it provides a higher capacitance in parallel with first switch 12.

Regarding second inductor/capacitor network 14 and second switch 15, the second switch is controlled so that it is OFF when first switch 12 is ON and vice versa. The addition of second switch 15 has the effect of improving the isolation across a broader range of frequencies, including high frequencies. However, this addition increases the insertion loss because of the leakage through the device capacitances. Inclusion of second inductor/capacitor network 14 reduces the insertion loss because of this leakage and also improves isolation at the resonant frequency. As will be see below, circuitry 11 can be mirrored about T2 to make a resonant RF switch structure (for example, a structure with an antenna electrically connected at T2).

Figure 3:
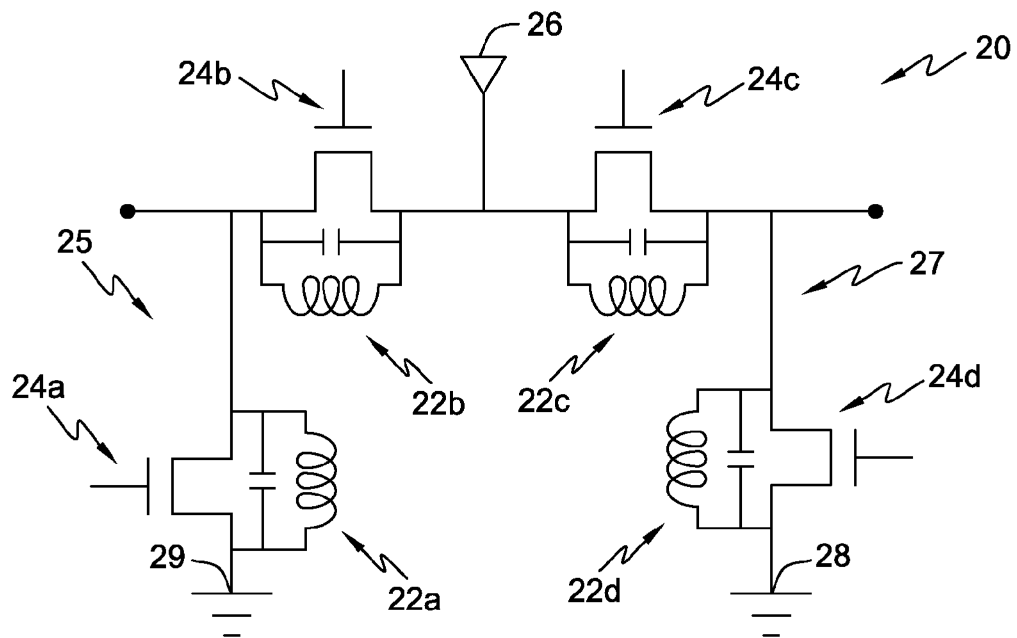
FIG. 3 is a circuit diagram showing a second embodiment of a resonant RF switch device according to the present invention.
Figure 4:
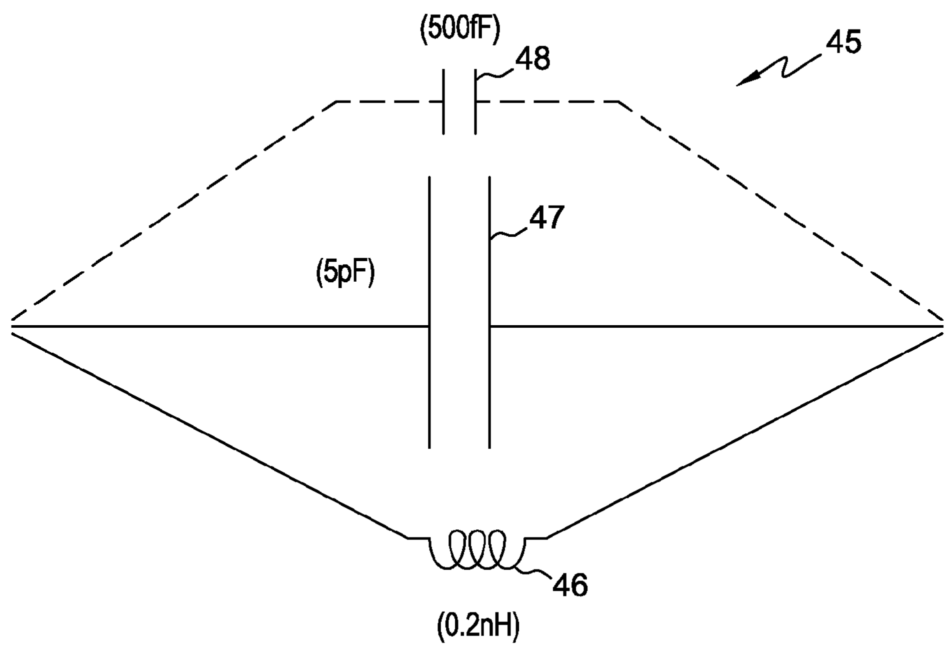
FIG. 4 is a circuit diagram showing an LC circuit and FET device arrangement according to an embodiment of the present invention.

FIG. 3 depicts resonant RF switch circuit 20 according to an embodiment of the present invention. Circuit 20 includes: LC circuits 22*a*, 22*b*, 22*c*, and 22*d*; FET devices 24*a*, 24*b*, 24*c*, and 24*d*; RF antenna 26; ground terminals 28 and 29; receiver series-shunt branch 25; and transmission series-shunt branch 27. The receiver series-shunt branch is shown to include FETs 24*a* and 24*b* and LC circuits 22*a* and 22*b*. The transmission series-shunt branch mirrors the receiver series-shunt branch about antenna 26 (that is, the transmission series-shunt branch is a minor image of the receiver series-shunt branch). In this embodiment, each FET device in the two series-shunt branches has, in a parallel arrangement, a corresponding one of the LC circuits. In that way, a lower insertion loss is available compared to a conventional RF switch circuit with no LC circuits. Also, the illustrated arrangement provides improved isolation of the FET devices, where the corresponding LC circuits serve to increase isolation of the FET. FIG. 4 is exemplary resonant RF switch 45 according to an embodiment of the present invention. Circuit 45 includes: inductor 46 (rated, for example, 0.2 nH; capacitor 47 (rated, for example, 5 pF); and FET device 48 (rated, for example, 500 fF).

Additional consideration in physical assembly of resonant RF switch circuit 20 can result in a reduced circuit footprint, or area, thus reducing overhead, or fixed costs, associated with the circuit. For example, a relatively large capacitor placed in one of the LC circuits will act to reduce the parallel inductance needed to achieve resonance. Further, a multiport inductor may be employed, such that a single inductor operates to achieve resonance for multiple series-shunt branches, such as both series-shunt branches 25 and 27.

It should be further noted that the circuit illustrated in FIG. 2 is a stacked resonant switch, that is, there is a series connection of more than one FET. This series connection enables withstanding applied voltage or power. Resonance is achieved when infinite impedance occurs at a particular frequency because of the parallel inductor and capacitor. In each resonant switch, the capacitance of the FET is resonated by the parallel inductor to create an open circuit in the OFF state. The series of resonant switches is an example of a stacked resonant switch.

Figure 5:
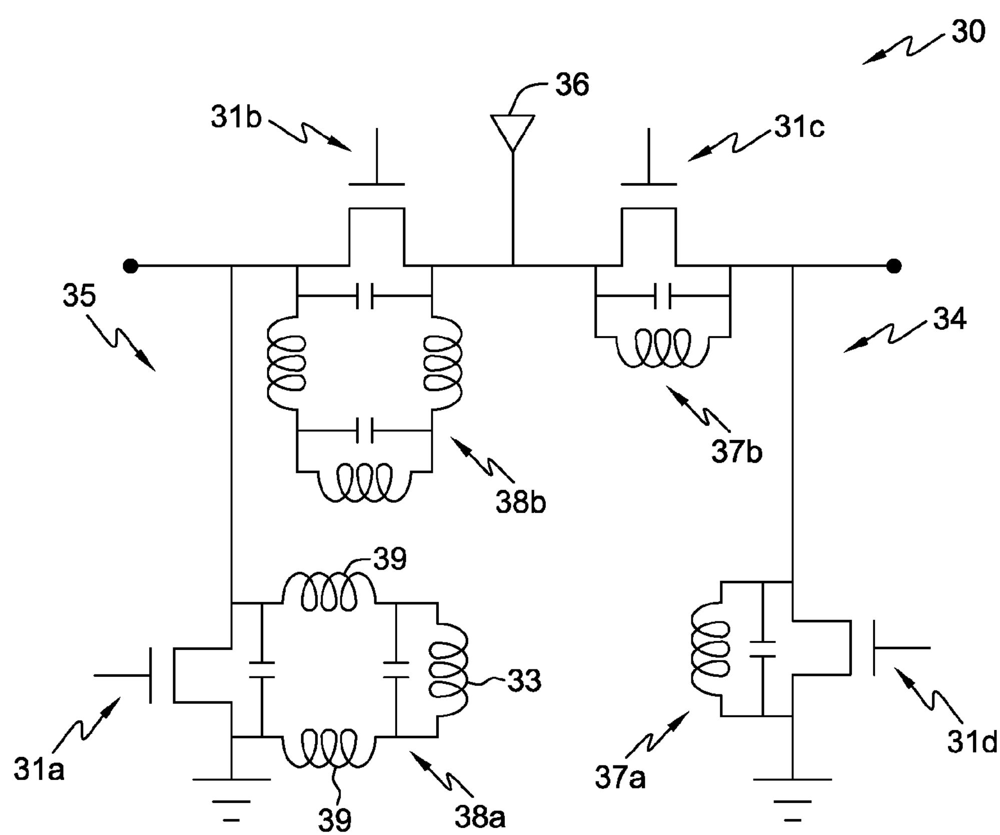
FIG. 5 is a circuit diagram showing a third embodiment of a resonant RF switch device according to the present invention.

FIG. 5 depicts resonant RF switch circuit 30 according to an embodiment of the present invention. Circuit 30 includes: receive branch resonant circuits 38*a*, 38*b*; duplicate inductors 39; inductor 33; transmission branch resonant circuits 37*a*, 37*b*; FET devices 31*a*, 31*b*, 31*c*, 31*d*; RF antenna 36;

receiver branch 35; transmission branch 34. In this example duplicate inductors 39 are employed in parallel to establish a symmetrical resonant circuit. While the illustrated circuit shows only branch 35 having the resonant circuits configured according to circuits 38*a* and 38*b*, branch 34 may also be configured with similar resonant circuits. Persons skilled in the art will understand that many configurations may be employed to achieve similar benefits when compared to conventional circuits, including: (i) lower insertion loss; (ii) improved isolation; and/or (iii) lower fixed cost.

Figure 6:
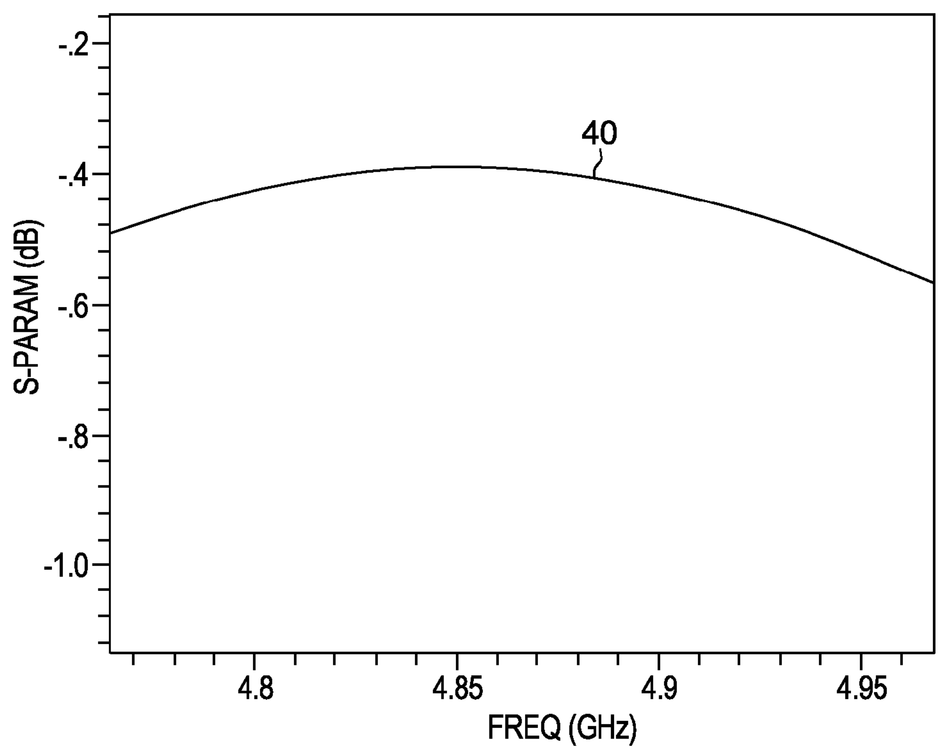
FIG. 6 is a chart illustrating a first performance parameter according to an embodiment of the present invention.

FIG. 6 depicts insertion loss values 40 vs frequency for an RF switch circuit prepared according to an embodiment of the present invention. Insertion loss is the measure of the signal lost because of the presence of the switch. Insertion loss is measured in dB and is the lowest at the resonant frequency, 4.85 GHz, as can be seen from the figure. On either side of the resonant frequency, insertion loss increases. At resonance, the insertion loss from the embodiment of the present invention will be lower than the conventional SPDT switch because of the LC network, which will resonate out all the device capacitances especially of the FETs in the shunt path thus creating an open circuit. However, in a conventional SPDT switch the device capacitances provide a leakage path thus increasing the insertion loss.

Figure 7:
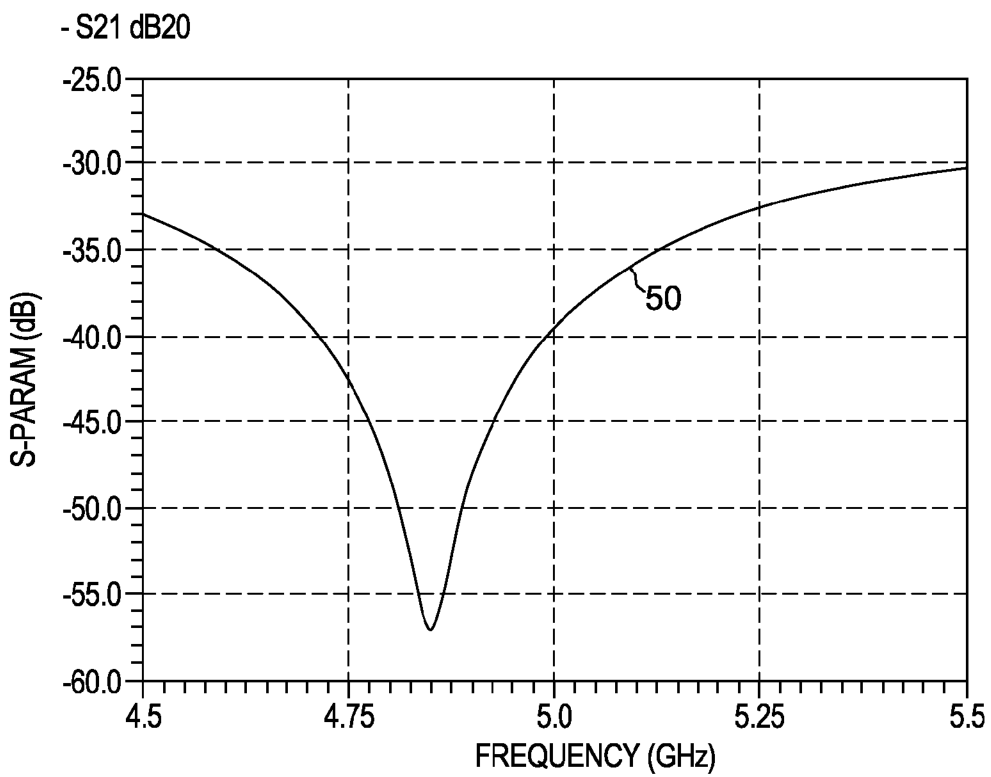
FIG. 7 is a chart illustrating a second performance parameter according to an embodiment of the present invention.

FIG. 7 depicts isolation values 50 vs frequency for an RF switch circuit prepared according to an embodiment of the present invention. Isolation is a measure of the amount of signal present at the unintended port because of the presence of signal at the desired port. As can be seen in FIG. 7, the isolation, measured in dB, is the highest at the resonant frequency of 4.85 GHz and lower on either side. At resonance, the isolation from the embodiment of the present invention will be significantly higher by about 30 dBm compared to the conventional SPDT switch. The LC network will resonate out all the device capacitances thus creating an open circuit thus preventing the signal from reaching the undesired port, creating a higher isolation. However, in a conventional SPDT switch the device capacitances provide a leakage path thus lowering the isolation.

Currently known switching circuits cannot cancel out the switch capacitances (device and parasitic) during both transmit and receive modes. Some embodiments of the present invention are directed to lower fixed costs through improved form-factor and/or reduced power consumption when compared with known switching circuits. Some embodiments of the present invention are directed to high performance integrated CMOS RF switches on a 200 mm platform.

Figure 8A:
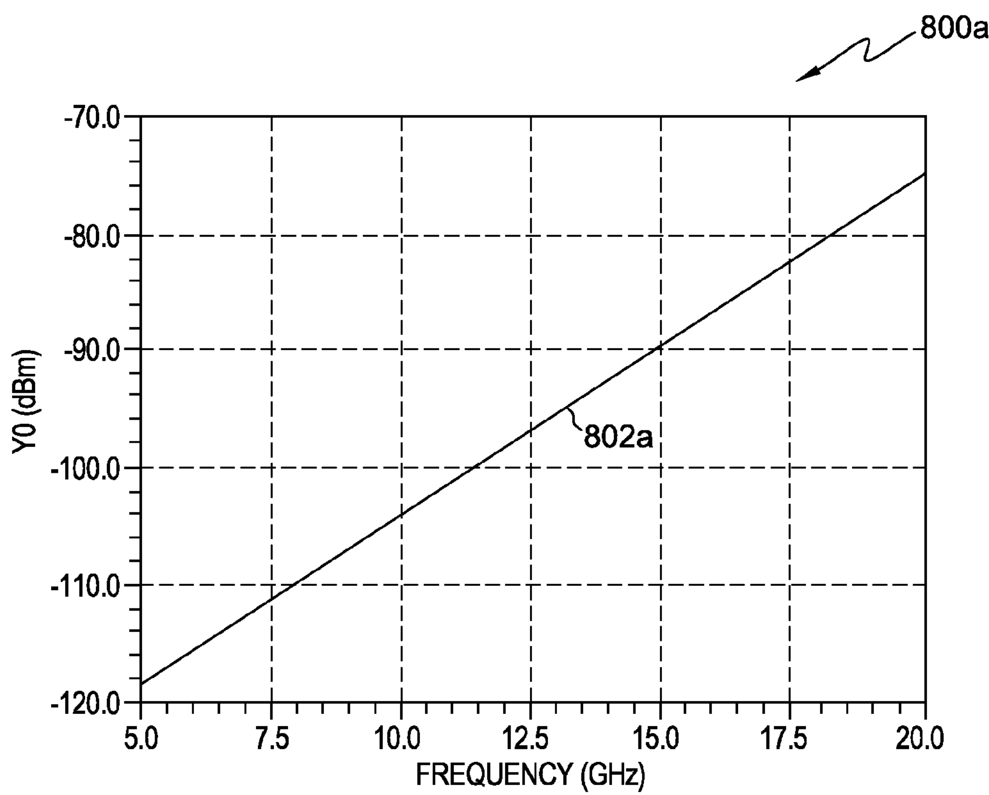
FIGS. 8A and 8B are charts depicting a third performance parameter according to an embodiment of the present invention.
Figure 8B:
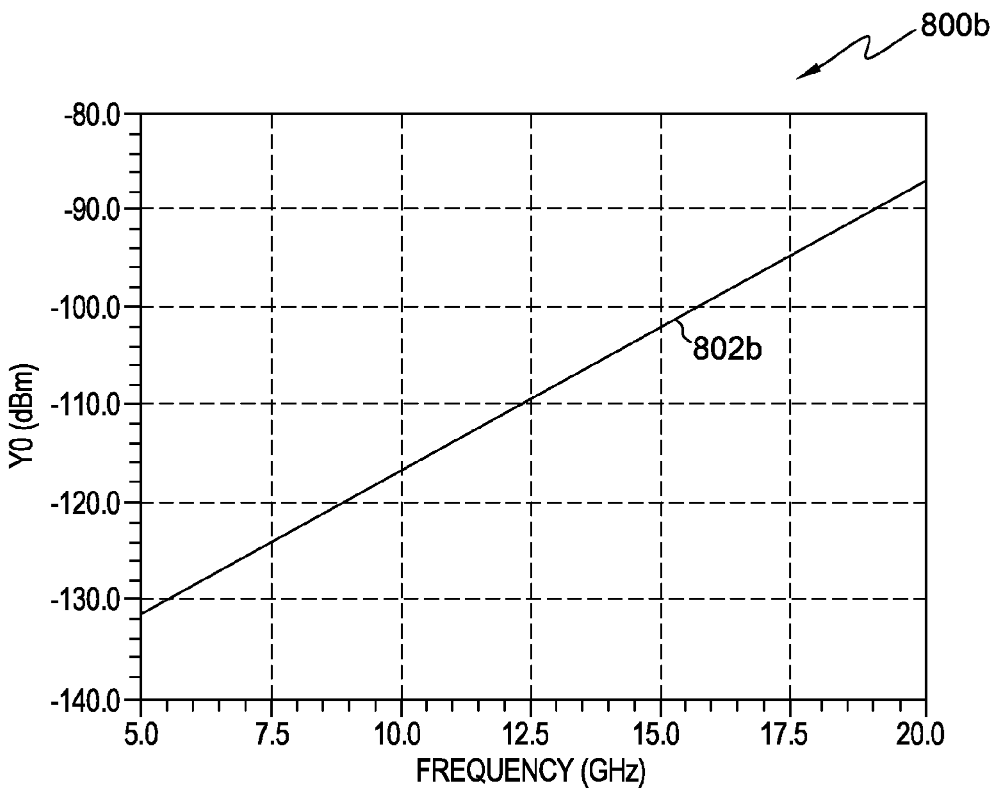

FIG. 8(*a*) shows chart 800*a* where curve 802*a* is plotted for the third harmonic power value at the antenna versus the input power at the transmit port when the transmit path is ON and the Receive path is Off. FIG. 8(*b*) shows chart 800*b* where curve 802*b* is plotted for the third harmonic power at the transmit port versus input power at the antenna when the receive path is ON and the transmit port is OFF. The third harmonic power levels are significantly lower in the resonant RF switch according to the present invention when compared to a conventional SPDT switch for the same reasons provided above for improved insertion loss and isolation values.

Advantages provided by some embodiments of the present invention include: (i) a reduction in the required inductor size; (ii) a reduction in the required inductor value; (iii) a reduced form-factor; (iv) a high degree of isolation; (v) low insertion loss; (vi) the same linearity as a conventional SPDT switch; and (vii) lower out-of-band harmonic power levels.

Features of embodiments in accordance with the present invention include: A) a parallel LC resonant element in parallel with each of the series branch FETs in a stacked RF switch; B) a parallel LC resonant element in parallel with each of the shunt branch FETs in a stacked RF switch; C) higher value capacitance placed in parallel to Coff, to reduce L value; D) flexibility of resonating the capacitance of each FET in the stack irrespective of the number of FETs in the series/shunt stack, the flexibility especially useful in asymmetric configurations; E) usage of one or more multiport inductors to resonate multiple series/shunt branches; and F) low frequency path to ground through the resonant inductors useful for ESD (electrostatic discharge) protection.

What is claimed is:

1. Circuitry comprising:
- a first switch;
- a second switch;
- a first inductor/capacitor (LC) network; and
- a second LC network;
- wherein:
- the first switch is connected between a first high frequency terminal and a second high frequency terminal;
- the first LC network is connected in parallel across the first switch;
- the second switch is connected between the first high frequency terminal and a first low frequency terminal;
- the second LC network is connected in parallel across the second switch; and
- the first and second switches are controlled so that the first and second switches have different ON/OFF status during operation of the circuitry.

2. The circuitry of claim 1, wherein:
- the first switch includes a field effect transistor; and
- the second switch includes a field effect transistor.

3. The circuitry of claim 1 wherein:
- the first inductor/capacitor (LC) network is configured to resonate such that a capacitance of the first switch is essentially cancelled out; and
- the second LC network is configured to resonate such that a capacitance of the second switch is essentially cancelled out.

4. The circuitry of claim 1, wherein the first and second LC networks each have a large capacitance reducing an inductance value required for a resonance condition.

5. The circuitry of claim 1, wherein the first LC network includes a first inductor and a second inductor, the first inductor arranged in parallel with the second inductor.

6. Circuitry comprising:
- a first series switch and a first shunt switch controlled such that the first series switch and the first shunt switch have different ON/OFF status during operation of the circuitry;
- a second series switch and a second shunt switch controlled such that the second series switch and the second shunt switch have different ON/OFF status during operation of the circuitry;
- the first series switch and the second series switch controlled so that the first series switch and the second series switch have different ON/OFF status during operation of the circuitry; and
- a first resonant circuit in parallel with the first series switch.

7. The circuitry of claim 6, further comprising:
- a multi-port inductor arranged to resonate a first series/shunt branch and a second series shunt branch;

wherein:

the first series/shunt branch includes the first series switch and the first shunt switch; and the second series/shunt branch includes the second series switch and the second shunt switch.

8. The circuitry of claim 6, further comprising:

an RF antenna in series with the first series switch and the second series switch.

9. The circuitry of claim 8, wherein:

the RF antenna is located between the first series switch and the second series switch; and the first series switch and the first shunt switch are arranged as a mirror image about the RF antenna to match an arrangement of the second series switch and the second shunt switch.

10. The circuitry of claim 6, further comprising:

a second resonant circuit in parallel with the second series switch.

11. The circuitry of claim 10, wherein the first resonant circuit includes a first inductor in parallel with a second inductor.

12. The circuitry of claim 10, further comprising:

a third resonant circuit in parallel with the first shunt switch; and a fourth resonant circuit in parallel with the second shunt switch.

13. The circuitry of claim 12, wherein the third resonant circuit includes a third inductor in parallel with a fourth inductor.

14. Circuitry comprising:

an RF antenna in series with a first terminal and a second terminal, the RF antenna between the first terminal and the second terminal;

a first series switch in series between the RF antenna and the first terminal;

a first shunt switch in between the first terminal and a low-frequency terminal;

the first series switch and the first shunt switch controlled such that the first series switch and the first shunt switch have different ON/OFF status during operation of the circuitry;

a second series switch in series between the RF antenna and the second terminal;

a second shunt switch in between the second terminal and a low-frequency terminal;

the second series switch and the second shunt switch controlled such that the second series switch and the second shunt switch have different ON/OFF status during operation of the circuitry;

a first resonant circuit in parallel with the first series switch and the first shunt switch; and a second resonant circuit in parallel with the second series switch and the second shunt switch;

wherein:

the first terminal is a communication-receiving terminal; and the second terminal is a communication-transmitting terminal.

15. The circuitry of claim 14, wherein the first series switch and the second series switch are controlled so that the first series switch and the second series switch have different on/off status during operation of the circuitry.

16. The circuitry of claim 14, wherein the first series switch and the first shunt switch are arranged in a configuration that mirrors, about the RF antenna, the configuration of the second series switch and the second shunt switch.

17. The circuitry of claim 14, further comprising:

a third resonant circuit in parallel with the first shunt switch; and a fourth resonant circuit in parallel with the second shunt switch.

18. The circuitry of claim 14, wherein:

the first resonant circuit includes a first inductor in parallel with a second inductor.

19. The circuitry of claim 14, further comprising:

a multi-port inductor arranged to resonate a first series/shunt branch and a second series shunt branch;

wherein:

the first series/shunt branch includes the first series switch and the first shunt switch; and the second series/shunt branch includes the second series switch and the second shunt switch.

* * * * *